(12) United States Patent
Onizuka

(10) Patent No.: US 7,105,872 B2
(45) Date of Patent: Sep. 12, 2006

(54) THIN FILM SEMICONDUCTOR ELEMENT AND METHOD OF MANUFACTURING THE SAME

(75) Inventor: Tatsuya Onizuka, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 10/878,539

(22) Filed: Jun. 29, 2004

(65) Prior Publication Data

US 2005/0035352 A1 Feb. 17, 2005

(30) Foreign Application Priority Data

Jul. 23, 2003 (JP) ............................. 2003-200468
Jul. 23, 2003 (JP) ............................. 2003-200470
Mar. 5, 2004 (JP) ............................. 2004-062299

(51) Int. Cl.
*H01L 27/10* (2006.01)

(52) U.S. Cl. ...................... 257/204; 257/223; 257/227; 257/291; 257/412

(58) Field of Classification Search .................... None
See application file for complete search history.

(56) References Cited

U.S. PATENT DOCUMENTS 5,851,860 A * 12/1998 Makita et al. .............. 438/166
6,166,396 A 12/2000 Yamazaki
6,495,857 B1 * 12/2002 Yamazaki .................... 257/59

FOREIGN PATENT DOCUMENTS

| JP | A 10-20345 | 1/1998 |
|----|------------|--------|
| JP | A 2000-81632 | 3/2000 |
| JP | A 2001-28439 | 1/2001 |
| JP | A 2001-102445 | 4/2001 |
| KR | 10-0260975 | 2/1996 |
| KR | 10-0401654 | 2/1997 |

* cited by examiner

*Primary Examiner*—Wai-Sing Louie
(74) *Attorney, Agent, or Firm*—Oliff & Berridge, PLC

(57) ABSTRACT

The invention provides a thin film semiconductor element and a method of manufacturing the same to achieve lowering the resistance of gate electrodes, lowering the capacitance of source electrodes, and enhancing etching characteristics. The thin film semiconductor element can include a semiconductor film provided on a substrate, source and drain electrodes connected to the semiconductor film, and a gate electrode provided on the semiconductor film with an insulating film interposed therebetween. The film thickness of the source and drain electrodes can be smaller than the film thickness of the gate electrode.

7 Claims, 8 Drawing Sheets

THIN FILM SEMICONDUCTOR ELEMENT AND METHOD OF MANUFACTURING THE SAME

BACKGROUND OF THE INVENTION

1. Field of Invention

The present invention relates to a thin film semiconductor element and a method of manufacturing the same

2. Description of Related Art

In active matrix substrates constituting electro-optical devices, such as liquid crystal display devices, thin film transistors (TFTs) have been used as switching elements. According to recent trend, patterning wiring lines finely for a TFT circuit accompanied with the narrow pixel pitch in a liquid crystal display device, or lowering TFT driving power accompanied with making the substrate large are required.

From the point of view, it has been considered to adopt a low resistance metal as a material for wiring lines or electrodes, such as gate electrodes or source and drain electrodes, in the TFT circuit. Particularly, it has been suggested that an aluminum-based material is used as the low resistance metal. See, for example, Japanese Unexamined Patent Application Publication No. 10-20345.

As a material for Al electrodes (wiring lines), Al alloys added with a few atom percent of Cu (copper), Nd (neodymium) and the like are conventionally used in addition to a high purity Al. Further, a laminated structure is used, in which an Al electrode is interposed between a cap layer for preventing the generation of corrosion or hillock and a barrier layer for preventing mutual diffusion between Al metal and a base film material.

FIGS. 8(a) to 8(d) show processes of manufacturing a TFT having an Al electrode with a laminated structure.

First, as shown in FIG. 8(a), an insulating layer 2, a semiconductor layer 5, a gate insulating layer 6, and a gate electrode 100 are formed in order on a transparent substrate 1. In FIG. 8(a), the semiconductor layer 5 and the gate electrode 100 can be formed by a patterning method using a conventional photolithography technique. Further, the semiconductor layer 5 can include a source region 5S, a channel region 5C, and a drain region 5D that are formed by ion doping. Furthermore, the gate electrode 100 has a laminated structure in which a Ti (titanium) layer, an Al (aluminum) layer, and a TiN (titanium nitride) layer are formed in this order on the gate insulating layer 6. The Ti (titanium) layer and the TiN (titanium nitride) layer play roles of a barrier layer and a cap layer, respectively.

Next, as shown in FIG. 8(b), a first interlayer insulating film 20 covers the gate electrode 100 and the gate insulating layer 6. Since the first interlayer insulating film 20 is formed in the same shape as the uneven shape of the gate electrode 100 and the gate insulating layer 6, the surface thereof have an uneven shape corresponding to the surface shape of the gate electrode 100 and the insulating layer 6. Further, in the first interlayer insulating film, contact holes 21 are formed to reveal the source region 5S and the drain region 5D.

Next, as shown in FIG. 8(c), the source and drain electrode material SD is formed to cover the first interlayer insulating film 20. Here, the source and drain electrode material SD has a laminated structure in which a Ti (titanium) layer, an Al (aluminum) layer, and a TiN (titanium nitride) layer are formed in this order on the first interlayer insulating film 20. Since the source and drain electrode material SD is formed in the same shape as the uneven shape of the first interlayer insulating film 20, the surface thereof has an uneven shape corresponding to the surface shape of the first interlayer insulating film 20.

Next, as shown in FIG. 8(d), patterning the source and drain electrode material SD using a photolithography method forms a drain electrode 23 and a source electrode 24.

In such a semiconductor element, by the potential difference between the gate electrode 100 and the semiconductor layer 5, the electric field of the gate electrode 100 affects the channel region 5C to trigger a switching operation between the source region 5S and the drain region 5D.

SUMMARY OF THE INVENTION

However, in such a semiconductor element, since the response of the gate electrode 100 affects directly to the switching characteristic of the semiconductor layer 5, it is required to more lower the resistance of the gate electrode 100 in order to improve the switching characteristic of the semiconductor layer 5. Further, in the source and drain electrode material SD, the adhesion intensity between the surface of the Ti layer and the surface of the first interlayer insulating film 20 is strong. Therefore, when the Ti layer is formed on the first interlayer insulating film 20, it is formed in the same shape as the uneven shape of the first interlayer insulating film 20 to adhere to the uneven shape portion. Thus, after the Ti layer is patterned (etched), a portion of the Ti layer is left as residues in the uneven shape portion. Furthermore, Al and Ti are easily alloyed with each other. Therefore, if the thickness of the Al layer in the source and drain electrode material SD is larger, both Al and Ti are left as residues on the uneven shape part to be a cause of the generation of a leakage current, thereby lowering the reliability of the semiconductor element.

In addition, FIG. 9 shows another cross section of a gate electrode. When a side-etching part 100a is formed at the time the gate electrode 100 is etched, cutout parts 20a of the first interlayer insulating film 20 are formed. The residue SDa of the source and drain electrode material SD is left on the cutout parts 20a, which cause a leakage current. Further, when etching time is set to be long enough to remove the source and drain electrode material SD, the source electrode 24 and the drain electrode 23 are side-etched, and materials for other films may be left in the side-etching parts.

It is an object of the invention to provide a thin film semiconductor element and a method of manufacturing the same to achieve lowering the resistance of gate electrodes, lowering the capacitance of source and drain electrodes, and enhancing an etching characteristic.

That is, a thin film semiconductor element according to the invention can include a semiconductor film provided on a substrate, source and drain electrodes connected to the semiconductor film, and a gate electrode arranged on the semiconductor film with an insulating film interposed therebetween. The film thickness of the source and drain electrodes can be smaller than the film thickness of the gate electrode.

In the invention, the gate electrode and the source and drain electrodes each have the meaning of gate wiring lines and source and drain wiring lines. Further, a variety of conventional metals may be adopted as the materials for the gate electrode and the source and drain electrodes as referred in the invention. For instance, it is preferable to use metals, such as Mo, W, Ta, Cr, and Al, as the materials.

According to the present invention, by making the gate electrodes thicker, it is possible to form gate electrodes in which the resistance of wiring lines is lowered. Since the response of the gate electrodes is improved with the construction, it is possible to directly enhance the switching characteristic of the semiconductor layer. Further, it is possible to make a circuit comprising the semiconductor elements consume low power.

Further, when the source and drain electrodes are formed to be thinner, etching time is shortened, and thus the amount of side etching on the source and drain electrodes is decreased. Therefore, it is possible to form the source and drain electrodes with a reasonable shape. Accordingly, it is possible to prevent the generation of the residues caused by the side etching. Furthermore, since the source and drain electrode material is thinly formed on an interlayer insulating layer having an uneven surface, it is possible to decrease the residue or corrosion which are left on the uneven surface compared to the conventional technique, thereby improving the etching characteristics of the semiconductor element. Moreover, since the capacitance of capacitors is lowered, it is possible to achieve a circuit having low power consumption.

Furthermore, in the semiconductor element according to the invention, the gate electrode and the source and drain electrodes each have a single layer structure of an Al-based metal.

According to the invention, since the materials for the gate electrode and the source and drain electrodes are Al-based metals, it is possible to lower the resistance of the components. Further, within the boundary of this specification, the term Al-based metal is referred to a metal or an alloy in which Al is contained at a higher percentage than other elements. Further, as the Al-based metal, an AlNd alloy in which a few atom percent of Nd is added to an Al metal may be used. Since the AlNd alloy has the characteristics not to generate hillocks and mutual diffusion with a base material, a cap metal layer or a barrier layer becomes unnecessary, and thus it is possible to simplify manufacturing processes.

In addition, a semiconductor element according to the invention can include a semiconductor film provided on a substrate; source and drain electrodes connected to the semiconductor film, and a gate electrode arranged on the semiconductor film with an insulating film interposed therebetween. The gate electrode and the source and drain electrodes each have a laminated structure of a plurality of metals, and the film thickness of a first lowest-layer provided at the bottom of each of the source and drain electrodes is larger than the film thickness of a second lowest-layer provided at the bottom of the gate electrode.

According to the invention, in the process of forming the source and drain electrodes using a dry etching method, the first lowest-layer metal is removed to surround the upper layer metal which is located above the first lowest-layer metal. Furthermore, since the first lowest-layer metal is formed to be thicker, with the progress of dry etching, the first lowest-layer metal is removed after the upper layer metal is completely removed. That is, it is possible to prevent the remaining of the upper layer material, thereby improving etching characteristics.

Further, it is possible to prevent the generation of a leakage current caused by the remaining of the upper layer metal remained in the uneven part of the interlayer insulating layer.

Furthermore, in the semiconductor element according to the invention, the gate electrode can include an Al-based metal above the second lowest-layer metal, and the source and drain electrodes each include an Al-based metal above the first lowest-layer metal.

According to the invention, by the etching method, the Al-based metal can be removed to be surrounded by the first lowest-layer metal. Therefore, it is possible to prevent the remaining of the Al-based metal, thereby improving etching characteristics. Further, it is possible to prevent the generation of a leakage current caused by the remaining of the Al-based metal remained in the uneven part of the interlayer insulating layer.

Moreover, in the semiconductor element according to the invention, the first lowest-layer metal and the second lowest-layer metal can be a refractory metal with a higher melting point than the Al-based metal. According to the invention, it is possible to prevent mutual diffusion between the Al-based metal and the base layer material of the refractory metal.

In addition, in the semiconductor element according to according to the invention, the gate electrode and the source and drain electrodes each can include a refractory metal with a higher melting point than the Al-based metal on the upper side of the Al-based metal.

According to the invention, it is possible to prevent the generation of hillocks of the Al-based metal caused by a heat treatment process, such as a CVD (chemical vapor deposition) process, in manufacturing processes.

Further, in the semiconductor element according to the invention, the film thickness of the Al-based metal in the gate electrode can be larger than the film thickness of the Al-based metal in each of the source and drain electrodes. According to the invention, by making the gate electrode thicker than the source and drain electrodes, it is possible to form the gate electrode in which the resistance of wiring lines is lowered, and thus the response of the gate electrode is improved. Therefore, it is possible to directly enhance the switching characteristics of the semiconductor layer. Furthermore, it is possible to realize low power consumption of a circuit comprising the semiconductor elements.

Further, according to the present invention, the film thickness of the Al-based metal in each of the source and drain electrodes can be smaller than that in the gate electrode. Therefore, etching time is shortened, and the amount of side etching on the source and drain electrodes is decreased, thereby forming source and drain electrodes with a reasonable shape. Thus, it is possible to prevent the generation of the residue caused by the side etching. Furthermore, since the Al-based metal layer can be thinly formed on the interlayer insulating layer with the surface of uneven shape, it is possible to decrease the residue or corrosion which is left on the surface of the uneven shape compared to the conventional technique and to enhance the etching characteristics. Furthermore, since the capacitance of capacitors is lowered, it is possible to realize a circuit having low power consumption.

Moreover, in the semiconductor element according to the present invention, the film thickness of the Al-based metal in each of the source and drain electrodes is one to ten times as large as the film thickness of the first lowest-layer metal. According to the present invention, it is possible to appropriately prevent the Al-based metal from remaining, and thus to improve etching characteristics. Further, it is possible to prevent the generation of a leakage current caused by the remaining of Al-based metal in the uneven part of the interlayer insulating layer.

In addition, in the semiconductor element according to the invention, the refractory metal includes any one of Ti, W, Ta, Mo, and Cr.

According to the invention, it is possible to obtain the same effects as in the foregoing semiconductor element. In addition, it is possible to appropriately prevent hillocks and mutual diffusion with the Al-based metal.

Particularly, when Ti is used as the refractory metal, Al is surrounded with Ti by a dry etching method since Al and Ti are easily alloyed with each other. That is, a structure in which a Ti metal layer is interposed between the Al metal layers makes it possible to appropriately perform Al etching as compared to a structure in which Al is independently provided, thereby decreasing the amount of Al residues.

Further, in the semiconductor element according to the present invention, the refractory metal is any one of a high purity metal, a metal nitride, and a metal oxide. According to the invention, it is possible to obtain the same effects as in the foregoing semiconductor element. In addition, it is possible to increase the adhesion between the refractory metal and a material to be contact with the refractory material.

For instance, in a case in which TiN composed of a Ti nitride is used as the refractory metal, when a material to be contact with the TiN contains a nitride (such as SiN) or an oxynitride (such as SiON), it is possible to increase the adhesion between TiN and a nitride or an oxynitride.

Furthermore, in the semiconductor element according to the present invention, the refractory material is composed of a laminated structure of plural kinds of metals. According to the invention, it is possible to obtain the same effects as in the foregoing semiconductor element.

Moreover, according to the invention, there is provided a method of manufacturing a semiconductor element the semiconductor element that can include a semiconductor film provided on a substrate, source and drain electrodes connected to the semiconductor film, and a gate electrode arranged on the semiconductor film with an insulating film interposed therebetween. The film thickness of the source and drain electrodes is smaller than the film thickness of the gate electrode.

According to the invention, by making the gate electrode thicker, it is possible to form the gate electrode in which the resistance of wiring lines is lowered and to improve the response of the gate electrode, thereby directly improving the switching characteristics of the semiconductor layer. Further, it is possible to realize the low power consumption of a circuit comprising the semiconductor elements.

In addition, since etching time is shortened by making the source and drain electrodes thinner, the amount of side etching on the source and drain electrodes can be decreased, and thus it is possible to form source and drain electrodes with a reasonable shape. Therefore, it is possible to prevent the generation of the residue caused by the side etching. Furthermore, since the source and drain electrode material is thinly formed on the interlayer insulating layer, it is possible to decrease the residue or corrosion which is left in the uneven part compared to the conventional technique, thereby improving etching characteristics. Moreover, sine the capacitance of capacitors is lowered, it is possible to realize a circuit having low power consumption.

Furthermore, according to the invention, there is provided a method of manufacturing a semiconductor element comprising a semiconductor film provided on a substrate, source and drain electrodes connected to the semiconductor film, and a gate electrode arranged on the semiconductor film with an insulating film interposed therebetween. The gate electrode and the source and drain electrodes each have a laminated structure of a plurality of metals, and the film thickness of a first lowest-layer metal provided at the bottom of each of the source and drain electrodes is larger than the film thickness of a second lowest-layer metal provided at the bottom of the gate electrode.

According to the invention, in the process of forming the source and drain electrodes using a dry etching method, the first lowest-layer metal is removed to surround the upper layer metal which is located on the upper side of the first lowest-layer metal. Furthermore, since the first lowest-layer metal is formed to be thicker, with the progress of the dry etching, the first lowest-layer metal is removed after the upper layer metal is completely removed. That is, it is possible to prevent the remaining of the upper layer material, thereby improving etching characteristics.

Moreover, it is possible to prevent the generation of a leakage current caused by the remaining of the upper layer metal in the uneven part of the interlayer insulating layer.

BRIEF DESCRIPTION OF THE DRAWINGS

This invention will be described with reference to the accompanying drawings, wherein like numerals reference like elements, and wherein.

DETAILED DESCRIPTION OF PREFERRED EMBODIMENTS

An embodiment of the invention will now be explained referring to FIGS. 1 to 7.

In the embodiment, a TFT array substrate constituting an active matrix liquid crystal display device is explained as an example of a thin film semiconductor element of the present invention. Further, a manufacturing process of a low-temperature polysilicon TFT is cited as an example of a TFT manufacturing process.

Figure 6:
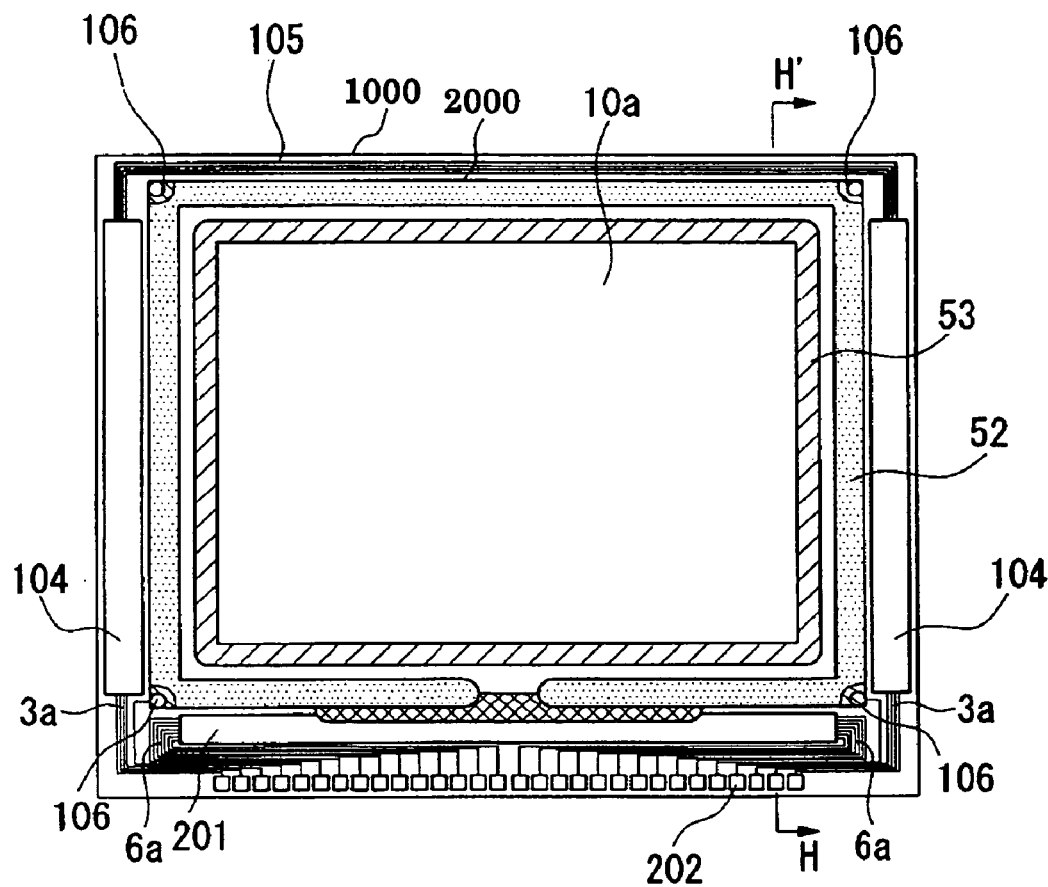
FIG. 6 is a plan view of a liquid crystal device according to the present invention.
Figure 7:
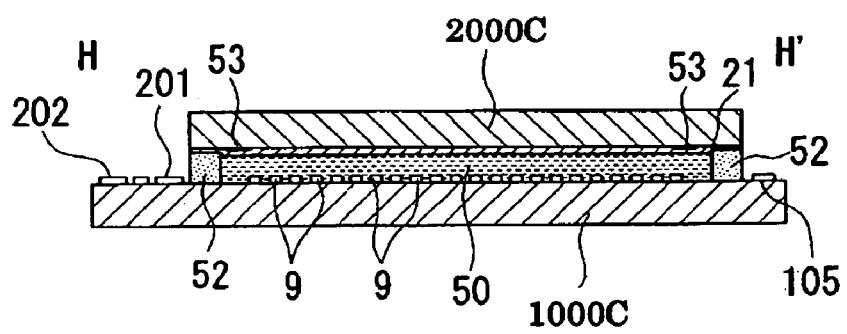
FIG. 7 is a cross-sectional view taken along the line H–H' of FIG. 6.
Figure 8A:
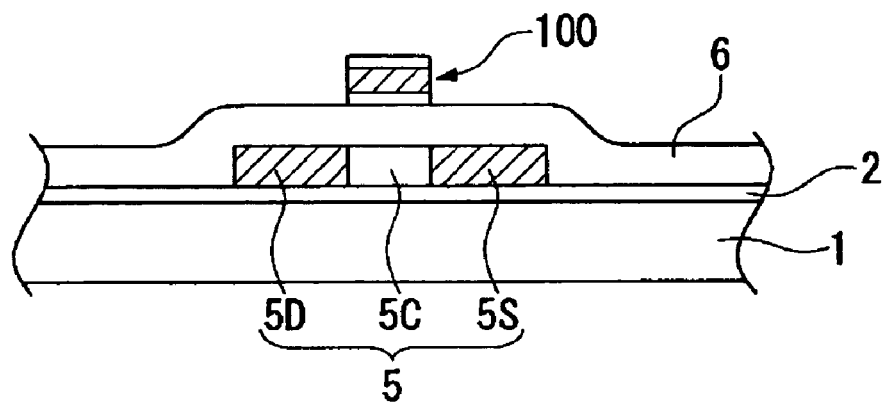
FIG. 8 is a cross-sectional view to illustrate processes of manufacturing a thin film semiconductor element of the prior art.
Figure 8B:
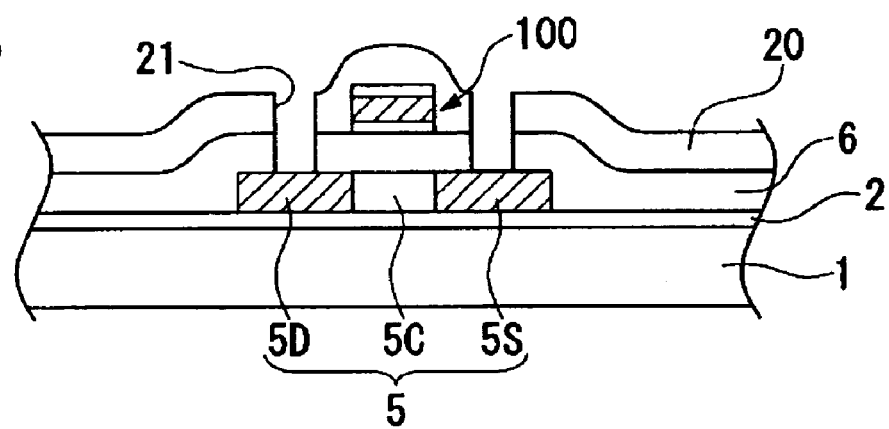
Figure 8C:
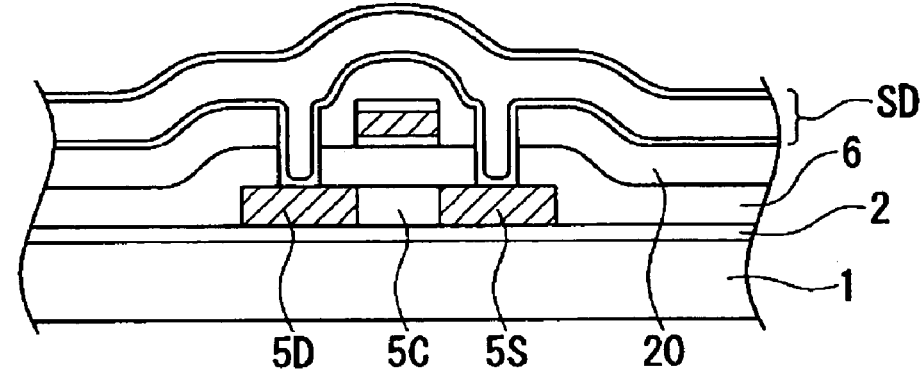
Figure 8D:
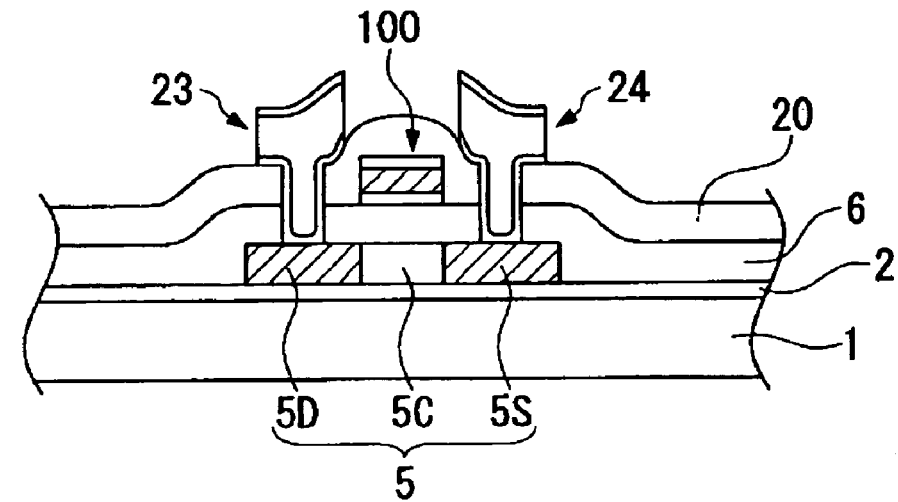
Figure 9:
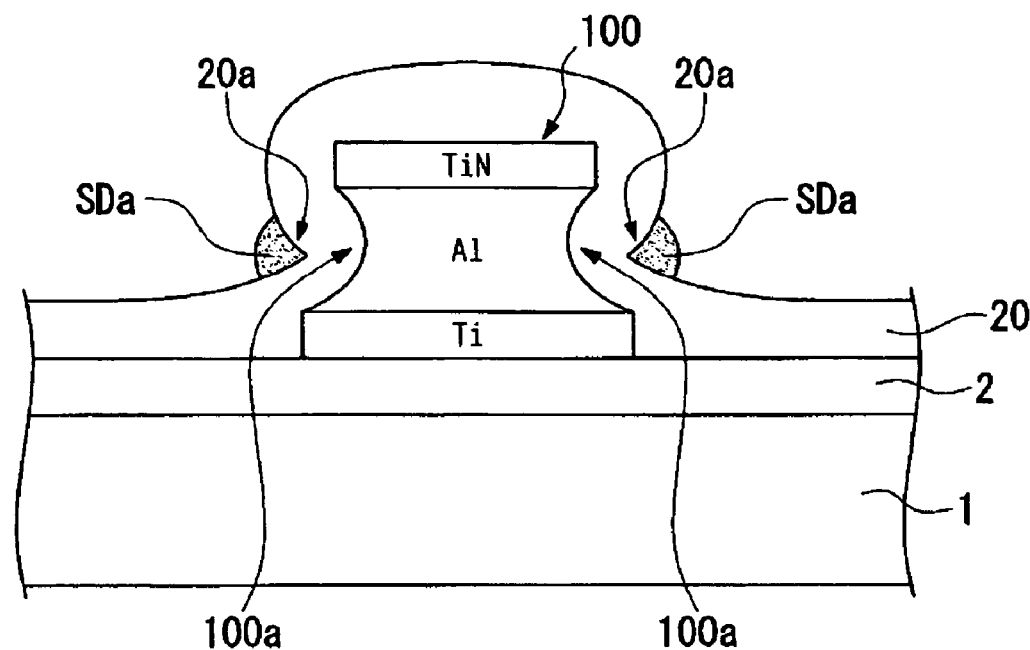
FIG. 9 is a plan view to illustrate the prior art.

FIGS. 1 to 4 are cross-sectional views to illustrate processes of manufacturing a thin film semiconductor of the present embodiment in order. FIG. 5 is a diagram illustrating the film thickness relationship of the main part in the thin film semiconductor element. FIG. 6 is a plan view of a TFT array substrate on which various components are formed, as seen from the side of a counter substrate. FIG. 7 is a cross-sectional view taken along the line H–H' of FIG. 6.

Further, in FIGS. 1 to 7, different scales are applied to each layer and element to understandably illustrate each layer and each element on the drawings with reasonable dimensions. Particularly, in FIG. 4, the film thicknesses of a gate electrode, a source electrode, and a drain electrode, and the thicknesses of layers constituting the respective electrodes are different in scale. The gate electrode, the source electrode, and the drain electrode according to the embodiment include the meaning of a gate wiring line, a source wiring line, and a drain wiring line, respectively.

According to the liquid crystal device of the embodiment as shown in FIGS. 6 and 7, a sealing material 52 is provided along the periphery of a TFT array substrate 1000, and a light-shielding film 53 is provided inside the sealing material 52 as a frame for defining the periphery of an image display region. In the outside region of the sealing material 52, a data line driving circuit 201 for driving data lines (not shown) by supplying data signals to the data lines (not shown) at a predetermined timing and external circuit connecting terminals 202 are provided along one side of the TFT array substrate 1000. In addition, scanning line driving circuits 104 for driving scanning lines (not shown) by supplying scanning signals to the scanning lines (not shown) at a predetermined timing are provided along two sides of the TFT array substrate 1000 that are adjacent to the one side. If the delay of the scanning signals supplied to the scanning lines (not shown) does not make a problem, it is preferable that the scanning line driving circuit 104 be placed on only one side. Further, the data line driving circuits 201 may be arranged on both sides of an image display region 10a. Furthermore, on the other side of the TFT array substrate 1000C, a plurality of wiring lines 105 is provided to connect the scanning line driving circuits 104 which are provided on both sides of the image display region.

Further, at least one of four corners on a counter substrate 2000, which is illustrated in the aforementioned first embodiment, a conductive material 106 is provided to electrically connect the TFT array substrate 1000 to the counter substrate 2000. As shown in FIG. 6, the counter substrate 2000 having almost the same outline as the sealing material 52 as shown in FIG. 7 is bonded to the TFT array substrate 1000 by the sealing material 52.

Next, a method of manufacturing the TFT array substrate of the present embodiment will be explained.

FIGS. 1 and 2 illustrate not only the processes of manufacturing pixel switching TFTs (N-channel TFTs) and storage capacitors used in the image display region, but also the processes of manufacturing TFTs (complementary N-channel TFTs and P-channel TFTs) that are used in a periphery region (a region in which the data line driving circuit 201, the scanning line driving circuits 104, etc., are formed) which is simultaneously formed with the above manufacturing processes.

Figure 1A:
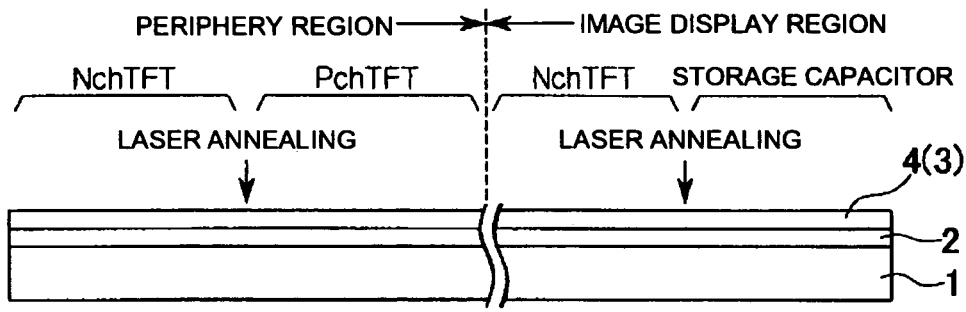
FIG. 1 is a cross-sectional view to illustrate processes of manufacturing a thin film semiconductor element according to the present invention.

As shown in FIG. 1(a), an insulating layer 2 is formed on a transparent substrate 1 (a substrate), such as a glass substrate, and an amorphous silicon layer (a semiconductor film) 3 is formed thereon. Thereafter, by heat treatment, such as laser annealing treatment, on the amorphous silicon layer 3, the amorphous silicon layer 3 is re-crystallized to change into a polysilicon layer (a semiconductor film) 4 with a film thickness of 50 nm. This step (the first step) is similarly performed on the image display region and the periphery region.

Figure 1B:
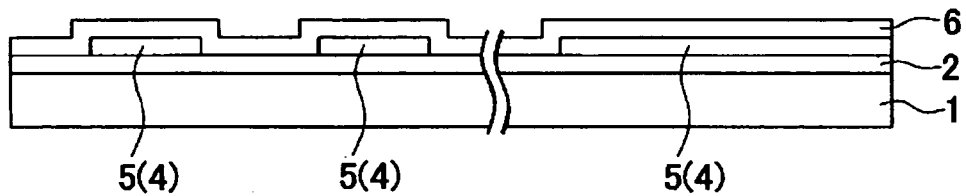

Next, as shown in FIG. 1(b), by using a photolithography method and a dry etching method, the polysilicon layer 4 is patterned to be a semiconductor layer 5 having an island shape, and a gate insulating layer 6 is formed thereon by a CVD method, etc. The thickness of the gate insulating layer 6 is about 100 to 150 nm, for instance. This second process is the same as in the image display region and the periphery region.

Figure 1C:
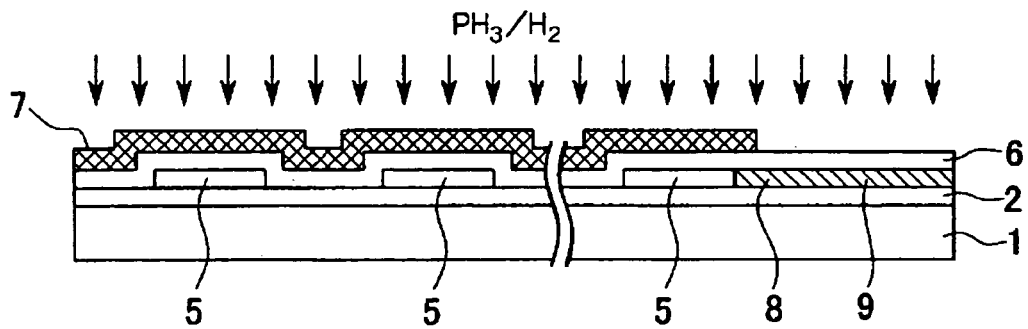

Next, as shown in FIG. 1(c), by the known photolithography method, a resist pattern 7 is formed in which connection parts of the N-channel TFTs and the storage capacitor, and regions to be lower electrodes of the storage capacitors among the image display region are opened. Thereafter, for instance, N-type impurity ions, such as $PH_3/H_2$ ions, are injected through the gate insulating layer 6 into positions on the semiconductor layer 5 to be the connecting parts and the lower electrodes. In this case, the injection amount of $^{31}P$ is, for example, about $3\times10^{14}$ to $5\times10^{14}/cm^2$, and the acceleration energy of about 80 keV is required. This third process as described above forms the connection parts 8 and the lower electrodes 9 of the storage capacitors.

Figure 2A:
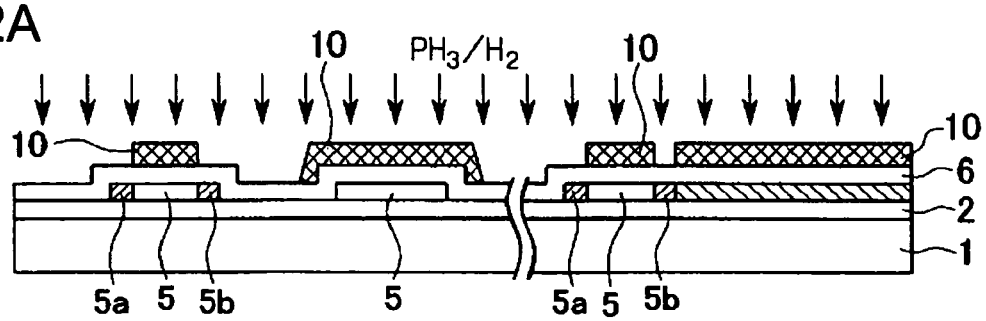
FIG. 2 is a cross-sectional view to illustrate the processes of manufacturing the thin film semiconductor element according to the present invention.

Next, after removing the resist pattern 7, as shown in FIG. 2(a), a resist pattern 10 is formed in which regions to be high-concentration source and drain regions of an N-channel TFT are opened. At this time, the resist pattern 10 covers regions to be a channel region and low-concentration source and drain regions of the N-channel TFT, a region to be a P-channel TFT, and regions in which the connecting part and the lower electrode of the storage capacitor are formed. Thereafter, N-type impurity ions, such as $PH_3/H_2$ ions, are injected through the gate insulating layer 6 to positions on the polysilicon layer 5 to be the high-concentration source and drain regions of the N-channel TFT. In this case, the injection amount of $^{31}P$ is, for example, about $1\times10^{15}$ to $3\times10^{15}/cm^2$, and the acceleration energy of about 80 keV is required. The fourth process as described above forms the high-concentration source region 5a and the high-concentration drain region 5b of the N-channel TFT.

Figure 2B:
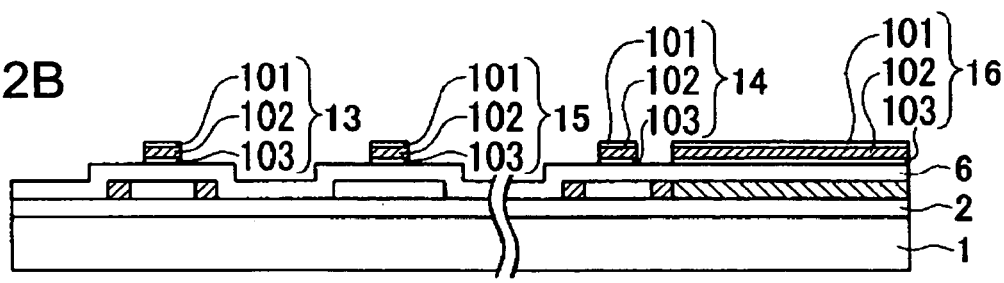

After removing the resist pattern 10, as shown in FIG. 2(b), a laminated structure is formed by depositing a Ti film (a refractory metal, a second lowest-layer metal) 103, an Al film (an Al-based metal, a metal layer) 102, and a TiN film (a refractory metal, a metallic nitride) 101 in succession. Here, for making the thickness of the Al film 102 larger than the thickness of an Al film (will be described below) in the source electrode 24, deposition is done with longer setting time. Further, the thickness of the Al film 102 is set to be 400 nm with the completion of the process. Further, the thickness of the Ti film 103 is smaller than that of a Ti film (will be described later) of the lowest-layer metal in the source and drain electrode material SD, which will be described later.

Furthermore, the resist pattern (not shown) is formed on the TiN film 101, and with using the resist pattern as a mask, gate electrodes 13 and 14 for the N-channel TFTs, a gate electrode 15 for the P-channel TFT, and an upper electrode 16 of the storage capacitor are formed by a dry etching method. With this fifth process as described above, the gate electrodes 13 and 14 for the N-channel TFTs, the gate electrode 15 for the P-channel TFT, and the upper electrode 16 of the storage capacitor, which are composed of a laminated layer of the TiN film 101, the Al film 102, and the Ti film 103, are formed, respectively. Thereafter, the resist pattern is removed.

Figure 2C:
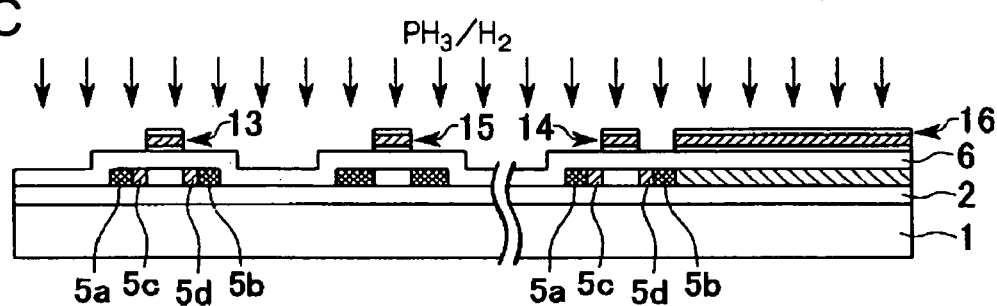

Next, as shown in FIG. 2(c), without using the resist pattern, N-type impurity ions, such as $PH_3/H_2$ ions, are injected into the entire surface of the substrate at a lower concentration. In this case, the injection amount of $^{31}P$ is, for instance, about $1\times10^{13}$ to $3\times10^{13}/cm^2$, and the acceleration energy of about 80 keV is required. This sixth process as described above forms a low-concentration source region 5c and a low-concentration drain region 5d of the N-channel TFT. At this time, since ion injection is done using only the gate electrode as a mask, N-type impurity ions may be injected into the side of the P-channel TFT. However, it does not cause any serious problem because of its low concentration.

Figure 2D:
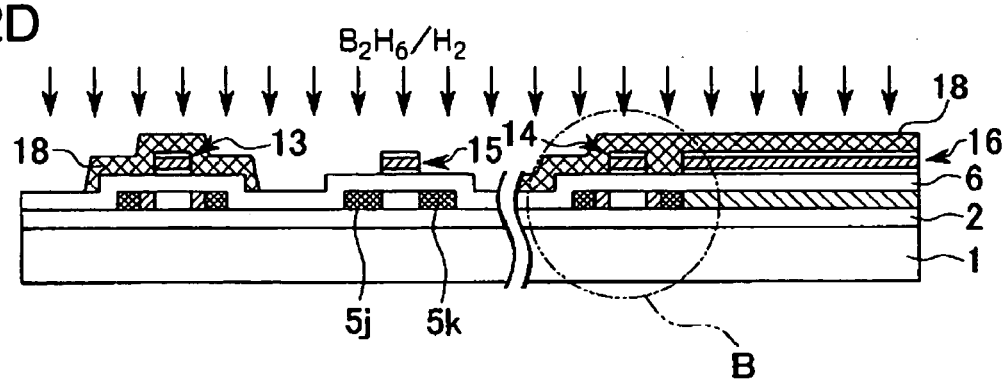

Next, as shown in FIG. 2(d), a resist pattern 18 is formed in which the forming regions of the P-channel TFTs are opened and the forming regions of the N-channel TFTs and the storage capacitors are covered. And then, with using the resist pattern 18 as a mask, for instance, p-type impurity ions, such as $B_2H_6/H_2$ ions, are injected. In this case, the injection amount of $^{11}B$ is, for instance, over $5\times10^{14}/cm^2$, and the acceleration energy of about 80 keV is required. This seventh process as described above forms a source region 5j and a drain region 5k of the P-channel TFT. After the completion of ion injection, the resist pattern 18 is removed.

The next processes will be described referring to FIG. 3 and FIG. 4. FIG. 3 and FIG. 4 are enlarged details of the principal part B of FIG. 2(d). Further, the construction of an area surrounding the gate electrode 14 will be described in the following. An explanation about the gate electrodes 13 and 15 will be omitted because they have the same structures as the gate electrode 14.

Figure 3A:
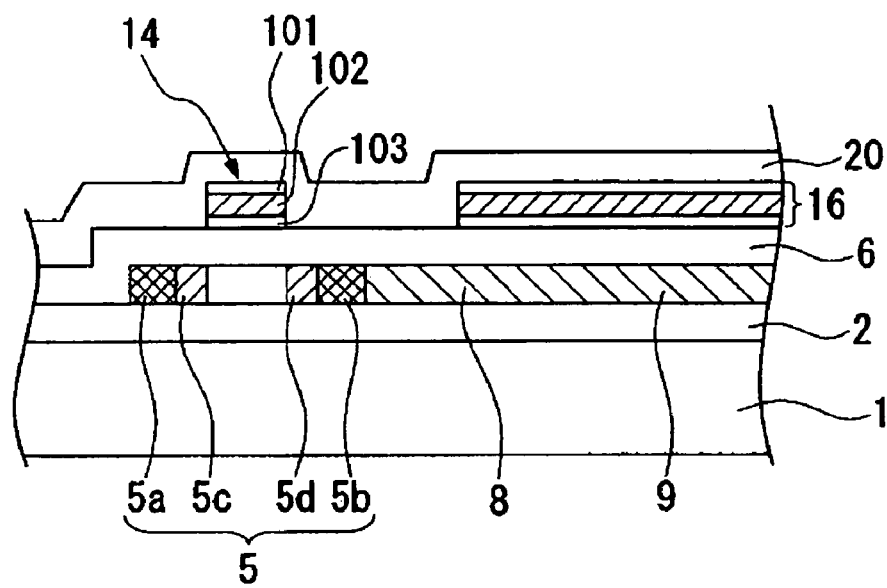
FIG. 3 is a cross-sectional view to illustrate the processes of manufacturing the thin film semiconductor element according to the present invention.

As shown in FIG. 3(a), a first interlayer insulating film 20 is formed. Since the first interlayer insulating film 20 is formed in the same shape as the uneven shape of the gate electrode 14 and the gate insulating layer 6, the surface has an uneven shape duplicating that of the gate electrode 14 and the gate insulating layer 6.

In the process of forming the first interlayer insulating film 20, even though heat stress is applied to the gate electrode 14, the TiN film 101, which is a refractory metal, is formed on the top of the gate electrode 14 to have heat resistance. Therefore, it is possible to prevent the generation of hillocks in the Al film 102. Further, in the case of adding a nitride (such as SiN) or an oxynitride (such as SiON) to the first interlayer insulating film 20, it is possible to increase the adhesion between TiN and a nitride or an oxynitride to obtain a reasonable insulation characteristic.

Figure 3B:
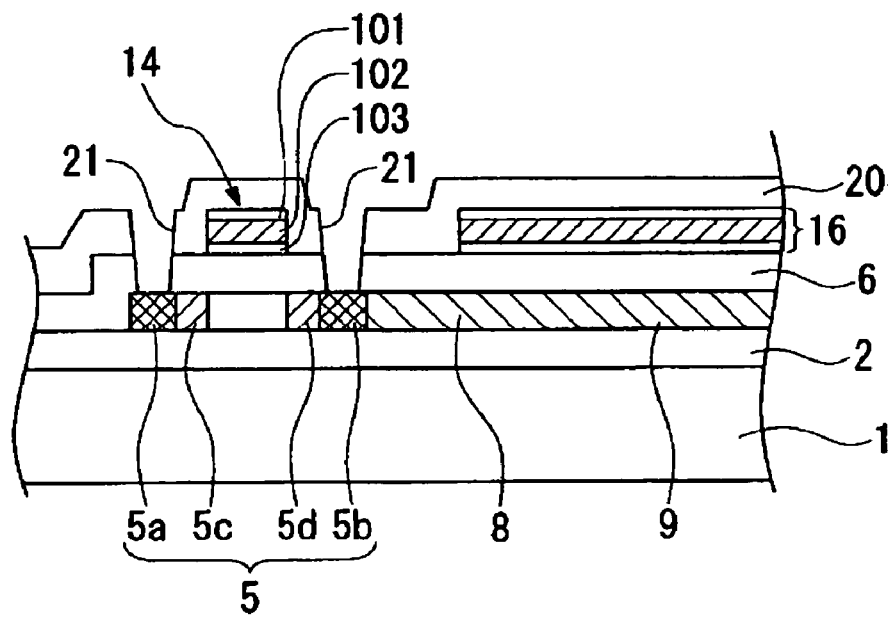

Next, as shown in FIG. 3(b), contact holes 21 are respectively formed, passing through the first interlayer insulating film 20 and the gate insulating layer 6, to come to the high-concentration source region 5a and the high-concentration drain region 5b. Here, the contact holes 21 are formed with the optimum diameter to realize that the thickness of the Al film after depositing the source and drain electrode material SD in the latter processes is smaller than the thickness of the Al film 102 in the gate electrode 14.

Figure 4A:
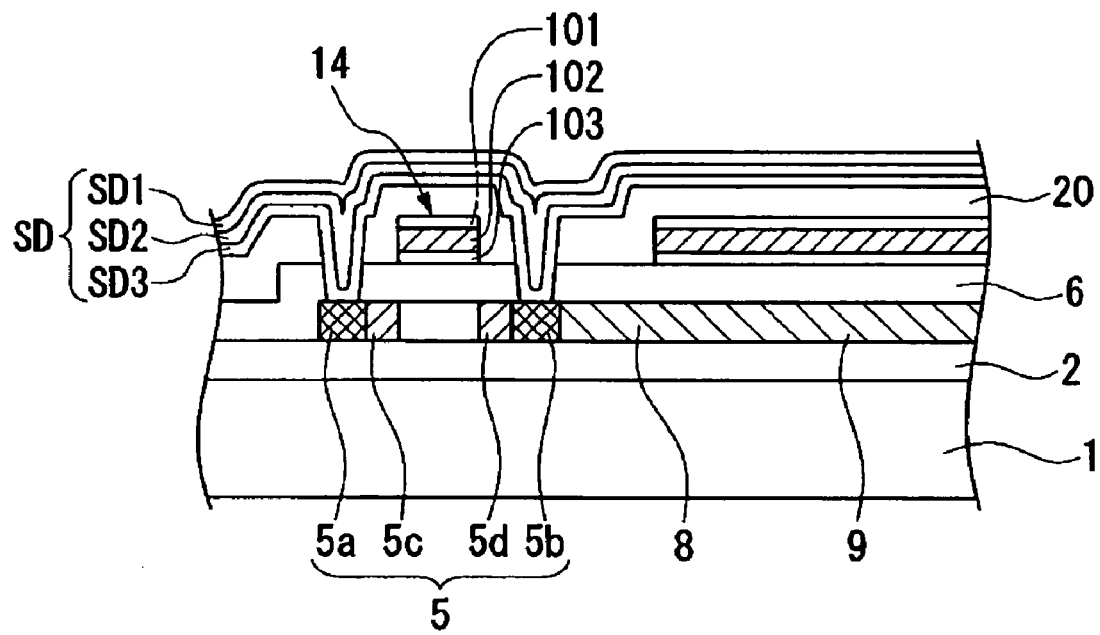
FIG. 4 is a cross-sectional view to illustrate the processes of manufacturing the thin film semiconductor element according to the present invention.

Next, as shown in FIG. 4(a), the source and drain electrode material SD is formed on the first interlayer insulating film 20 or to cover the contact holes 21. Here, the source and drain electrode material SD can be composed of a laminated structure obtained by depositing a Ti film (a refractory metal, the first lowest-layer metal) SD3, an Al film (an Al-based metal, a metal layer) SD2, and a TiN film (a refractory metal, a metal nitride) SD1, in succession, from the side of the lower layer. The thickness of the Al film SD2 in the source and drain electrode material SD come to be about half of the thickness of the Al layer 102 in the gate electrode 14. Further, the thickness of the Ti film SD3 is set to be larger than the thickness of the Ti film 103 in the gate electrode 14.

Figure 4B:
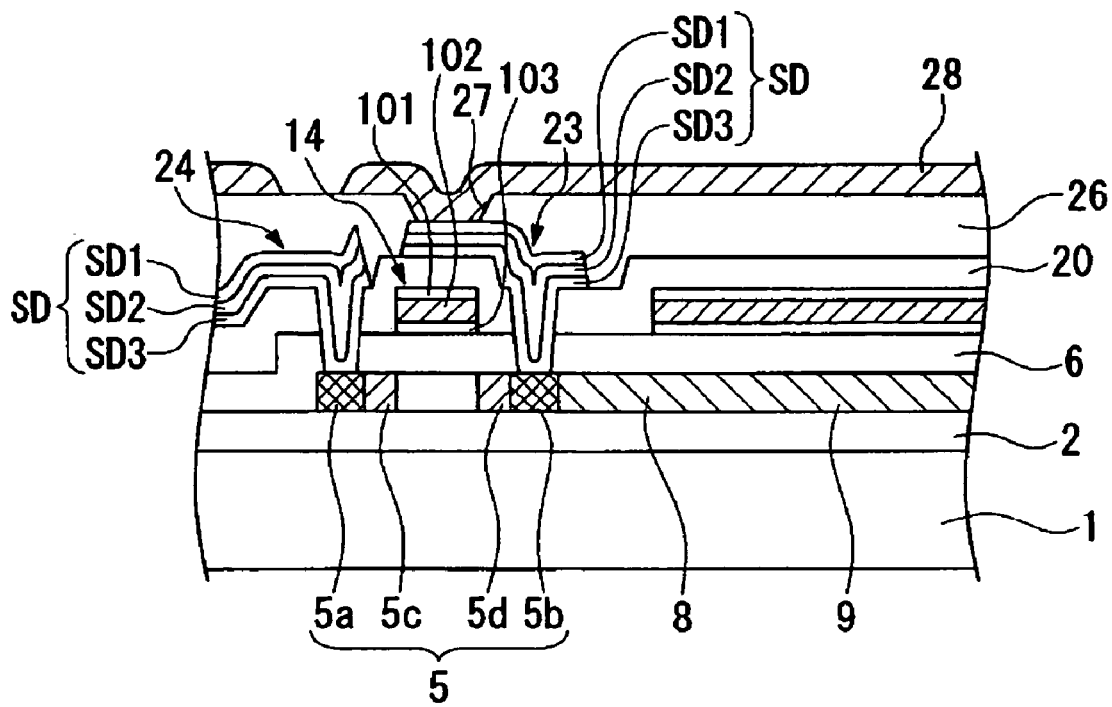

Next, as shown in FIG. 4(b), by patterning with the conventionally known photolithography method and the dry etching method, a source electrode 24 and a drain electrode 23 are formed.

Here, since the thickness of the Al film SD2 is smaller than the thickness of the Al film 102 in the gate electrode 14, the etching time of the Al film SD2 is shortened, and thus the amount of side etching on the Al film SD2 is decreased. Further, since Al and Ti may be easily alloyed with each other, both Al and Ti are etched from the surface of the first interlayer insulating film 20 in the etching process. Further, since the Ti film SD3 has been thicker, the Ti film SD3 is removed after the Al film SD2 is completely removed. Therefore, even though the first interlayer insulating film 20 has an uneven surface to allow residues to be left, it is possible to prevent the etching residue or corrosion of the Al film SD2.

Further, a second interlayer insulating film 26 is formed, and then a contact hole 27 is formed passing through the second interlayer insulating film 26 to come to a drain electrode 23. In succession, a transparent conductive material, such as ITO (Indium Tin Oxide), is formed the entire surface, and the ITO film is then patterned by a photolithography method to form the pixel electrode 28 that is connected to the high-concentration drain region 5b of the N-channel TFT through the drain electrode 23. By the aforementioned processes, the TFT array substrate is completed.

In the process for forming the second interlayer insulating film 26, even though heat stress is applied to the source electrode 24 and the drain electrode 23, it is possible to prevent the generation of hillocks in the Al film SD2 since the TiN film SD1 composed of a refractory metal is formed on the top of the source and drain electrode material SD. Further, in the case of the second interlayer insulating film 26 including a nitride (such as SiN) or an oxynitride (such as SiON), it is possible to increase the adhesion between TiN and a nitride or an oxynitride to obtain a reasonable insulation characteristic.

Next, referring to FIG. 5, the film thicknesses of the respective layers constituting the gate electrode 14 and the source and drain electrodes 24 and 23 are described. In FIG. 5, the gate electrode 14 and the source electrode 24 are taken as examples for explanation. The film thickness relationship of the respective layers constituting the gate electrodes 13 and 15 and the upper electrode 16 is the same as the gate electrode 13, and the film thickness relation of the layers constituting the drain electrode 23 is the same as the source electrode 24.

Figure 5A:
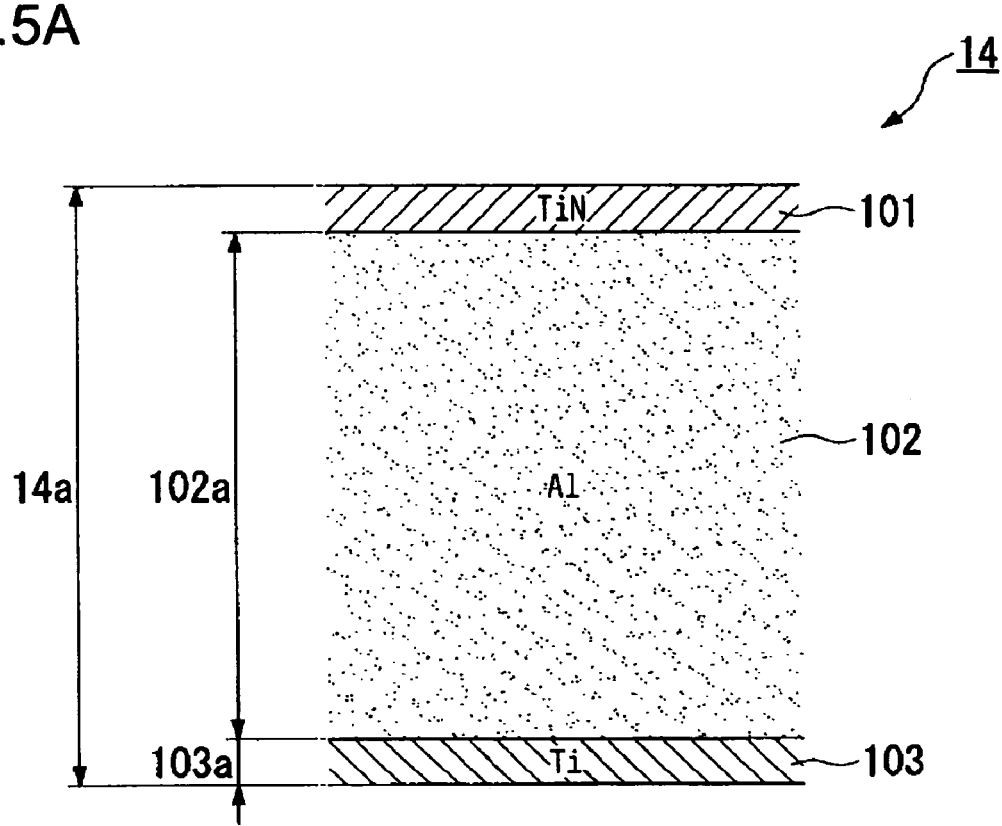
FIG. 5 is a diagram to illustrate the thickness relationship of layers in a principal part of the thin film semiconductor element according to the present invention.
Figure 5B:
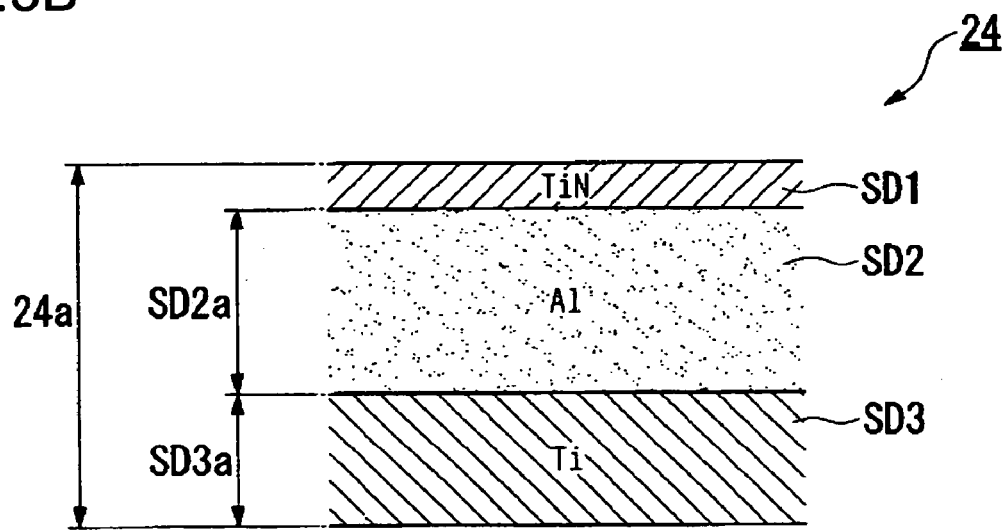

Further, in FIGS. 5(a) and 5(b), in order to understandably illustrate the embodiment, different scales are applied to the thickness of the respective layers forming the electrodes 14 and 24.

FIG. 5(a) shows the construction of the gate electrode 14 that is composed of a laminated structure of the Ti film 103, the Al film 102, and the TiN film 101. Further, the FIG. 5(b) shows the construction of the source electrode 24 that is composed of a laminated structure of the Ti film SD3, the Al film SD2, and the TiN film SD1.

As shown in FIG. 5(a) and FIG. 5(b), the total film thickness 14a of the respective layers constructing the gate electrode 14 is larger than the total film thickness 24a of the respective layers constructing the source electrode 24.

In addition, the film thickness SD3a of the Ti film SD3 located at the bottom of the source electrode 24 is larger than the film thickness 103a of the Ti film 103 located at the bottom of the gate electrode 14, and the film thickness 103a is about 10 to 80% of the film thickness SD3a.

Further, the film thickness 102a of the Al film 102 in the gate electrode 14 is larger than the film thickness SD2a of the Al film SD2 in the source electrode 24. Further, the film thickness 102a is under about four times the film thickness SD2a.

Moreover, in the source electrode 24 as shown in FIG. 5(b), it is preferable that the film thickness SD2a of the Al film SD2 be one to ten times larger than the film thickness SD3a of the Ti film SD3.

Furthermore, in FIG. 5(a) and FIG. 5(b), it is preferable that the thicknesses of the TiN film 101 and the TiN film SD1 which are respectively located at the tops of the gate electrode 14 and the source electrode 24 be about one-tenth to ten times the film thickness SD3a of the Ti film SD3.

Even though processes subsequent to the above processes are not shown, in the case of a TFT array substrate for a liquid crystal display device, an alignment film made of, for instance, polyimide, subjected to a rubbing process is formed on the entire surface of the substrate including the pixel electrodes 28. On the other hand, a common electrode, an alignment film and the like are formed on the side of a counter substrate. And then, the TFT array substrate and the counter substrate are bonded to each other, and liquid crystal is injected into the gap between the two substrates to complete a liquid crystal device according to the present embodiment.

As described above, since the gate electrode 14 is thicker than the source electrode 24 and the drain electrode 23, it is possible to decrease the wiring line resistance and to improve the response of the gate electrode 14, thereby directly enhancing the switching characteristic of the semiconductor layer 5. Further, low power consumption is realized in the circuits adopting the semiconductor elements.

In addition, since the film thickness 102a of the Al film 102 in the gate electrode 14 is larger than the film thickness SD2a of the Al film SD2 in the source electrode 24 or the drain electrode 23, it is possible to form the gate electrode 17 with a low wiring line resistance. Therefore, the same effects as the above are obtained.

Further, since the source and drain electrodes 24 and 23 are thinner than the gate electrode 14, the etching time is shortened, and thus the amount of side etching on the source electrode 24 and the drain electrode 23 is decreased to form the source and drain electrodes in a reasonable shape. Therefore, it is possible to prevent the generation of the residues caused by the side etching. Further, since the source and drain electrode material SD is thinly formed on the first interlayer insulating film 20 having an uneven shape surface, the residue or corrosion left on the uneven surface is decreased as compared with conventional processes, and etching characteristics can be improved. Furthermore, the capacitance decreases to realize a circuit having low power consumption.

In addition, since the Ti film SD3 is thicker than the Al film SD2 in the source and drain electrodes 24 and 23, it is possible to prevent the Al film SD2 from being left on the first interlayer insulating film 20, and the residue or corrosion left on the uneven surface is decreased. Therefore, etching characteristics can be improved as compared with conventional processes. Thus, since the residues of the Al film SD2 are not left on the first interlayer insulating film 20, it is possible to prevent the generation of a leakage current.

Further, since Ti and Al may be easily alloyed with each other, it is possible to etch in the state of Ti surplus to promote the removal of Al, as compared with a case in which only Al is etched.

Furthermore, since the film thickness SD2a of the Al film SD2 is one to ten times larger than the film thickness SD3a of the Ti film SD3 in the source and drain electrodes 24 and 23, it is possible to appropriately prevent the Al film SD2 from remaining, and thus etching characteristics can be improved. In addition, it is possible to prevent the generation of a leakage current caused by the remaining of the Al film SD2 on the uneven part of the first interlayer insulating film 20.

Moreover, since the refractory metal Ti is formed on the top and bottom of the Al film 102 and the Al film SD2 in the gate electrode 14 and the source and drain electrodes 24 and 23, respectively, it is also possible to prevent hillocks caused by heat treatment in manufacturing processes and to prevent mutual diffusion between the group of the gate insulating film 6, the first interlayer insulating film 20, and the second interlayer insulating film 26, and the group of the Al film 102 and the Al film SD2.

In addition, since TiN (a metal nitride) among a variety of refractory metals is adopted for the TiN film 101 and the TiN film SD1, it is also possible to increase the adhesion between the TiN films 101 and SD1 and a nitride (such as SiN) or an oxynitride (such as SiON) which is into contact with the TiN films 101 and SD1.

Further, it should be understood that the invention is not limited to these embodiments, and variations, modifications, or the like within the range in which the object of the invention can be achieved are included in the present invention.

For instance, according to the embodiment, the gate electrode 14, the drain electrode 23, and the source electrode 24a respectively have a laminated structure in which an Al-based metal, which is an intermediate layer, is interposed between two refractory metal layers. However, the invention may adopt a single layer structure of an Al alloy (an Al-based metal), instead of the laminated structure. In this case, it is preferable to adopt an AlNd film obtained by adding Al to Nd. Since the AlNd film is inclined not to generate hillocks and mutual diffusion with a base material, a cap metal layer or a barrier metal layer become unnecessary. Therefore, there is an advantage that it is possible to omit the process of manufacturing those layers. Further, it is preferable to adopt a variety of metallic materials, such as Mo, W, Ta, Cr and Ti, which are conventionally known, in addition to an Al-based metal.

Further, it is possible to adopt any one of W, Ta, Mo, and Cr in addition to Ti as a refractory metal. Furthermore, it is also possible to adopt a nitride or an oxide of a refractory metal, or to form a laminated structure of the layers made of a refractory metal.

Furthermore, the TFT array substrate having active matrix liquid crystal may have the construction of the so-called top gate-type TFTs. However, it may have the construction of the bottom gate-type TFTs.

Moreover, even though the embodiments illustrate examples in which laminated films of the invention are used for gate electrodes, the laminated films may be applicable to conductive layer patterns or wiring lines in addition to the gate electrodes. In addition, the present invention may be applicable to active matrix substrates for devices other than the liquid crystal device. Furthermore, the invention may be applicable to thin film semiconductor elements other than the active matrix substrate.

Accordingly, while this invention has been described in conjunction with the specific embodiments thereof, it is evident that many alternatives, modifications, and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. A thin film semiconductor element, comprising:

a semiconductor film provided above a substrate;

source and drain electrodes coupled to the semiconductor film; and a gate electrode arranged on the semiconductor film with an insulating film interposed therebetween, the gate electrode having a first metal provided at a bottom of the gate electrode, a first Al-based metal provided above the first metal, and a first refractory metal with a higher melting point than that of the first Al-based metal provided above the Al-based metal, the source and drain electrodes having a second metal provided at a bottom of each the source and drain electrodes, a second Al-based metal provided above the second metal, and a second refractory metal with a higher melting point than that of the second Al-based metal provided above the second Al-based metal, and a film thickness of the second Al-based metal being about half of the first Al-based metal.

2. A thin film semiconductor element, comprising:

a semiconductor film provided above a substrate;

source and drain electrodes coupled to the semiconductor film; and a gate electrode arranged on the semiconductor film with an insulating film interposed therebetween, the gate electrode having a first metal provided at a bottom of the gate electrode, a first Al-based metal provided above the first metal, and a first refractory metal with a higher melting point than that of the first Al-based metal provided above the Al-based metal, the source and drain electrodes having a second metal provided at a bottom of each the source and drain electrodes, a second Al-based metal provided above the second metal, and a second refractory metal with a higher melting point than that of the second Al-based metal provided above the second Al-based metal, and a film thickness of the second metal being larger than a film thickness of the second refractory metal.

3. The thin film semiconductor element according to claim 2, the first metal and being a refractory metal with a higher melting point than the first Al-based metal.

4. The thin film semiconductor element according to claim 2, the second metal being a refractory metal with a higher melting point than the second Al-based metal.

5. The thin film semiconductor element according to claim 2, the refractory metal including any one of Ti, W, Ta, Mo, and Cr.

6. The thin film semiconductor element according to claim 2, the refractory metal being any one of a high purity metal, a metal nitride, and a metal oxide.

7. The thin film semiconductor element according to claim 2, the refractory material being composed of a laminated structure of plural kinds of metals.

* * * * *